United States Patent
Hou et al.

(10) Patent No.: US 11,854,983 B2
(45) Date of Patent: Dec. 26, 2023

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Shang-Yun Hou, Jubei (TW); Hsien-Pin Hu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/873,876

(22) Filed: Jul. 26, 2022

(65) Prior Publication Data

US 2022/0367362 A1    Nov. 17, 2022

Related U.S. Application Data

(62) Division of application No. 16/887,458, filed on May 29, 2020, now Pat. No. 11,569,172.

(60) Provisional application No. 62/884,517, filed on Aug. 8, 2019.

(51) Int. Cl.
| | |
|---|---|
| *H01L 23/48* | (2006.01) |
| *H01L 23/538* | (2006.01) |
| *H01L 23/498* | (2006.01) |
| *H01L 21/48* | (2006.01) |
| *H01L 21/56* | (2006.01) |
| *H01L 23/31* | (2006.01) |

(52) U.S. Cl.
CPC ........ *H01L 23/5381* (2013.01); *H01L 21/486* (2013.01); *H01L 21/56* (2013.01); *H01L 23/3121* (2013.01); *H01L 23/49861* (2013.01); *H01L 23/5384* (2013.01)

(58) Field of Classification Search
CPC ............ H01L 23/5381; H01L 23/5384; H01L 23/3121; H01L 23/3135
USPC .......................................... 257/686, 787, 790
See application file for complete search history.

(56) References Cited

U.S. PATENT DOCUMENTS

| | | | |
|---|---|---|---|
| 7,554,195 B2 | 6/2009 | Zingher et al. | |
| 7,906,860 B2 | 3/2011 | Meyer et al. | |
| 8,742,576 B2 | 6/2014 | Thacker et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,385,110 B2 | 7/2016 | Yeh et al. | |
| 9,425,126 B2 | 8/2016 | Kuo et al. | |
| 9,443,783 B2 | 9/2016 | Lin et al. | |
| 9,443,824 B1* | 9/2016 | We ...................... H01L 25/0655 |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2* | 8/2017 | Su ........................... H01L 25/50 |
| 2011/0304349 A1 | 12/2011 | Stillman et al. | |

(Continued)

*Primary Examiner* — Nitin Parekh

(74) *Attorney, Agent, or Firm* — Slater Matsil, LLP

(57) ABSTRACT

Semiconductor devices and methods of manufacture are provided. In embodiments the semiconductor device includes a substrate, a first interposer bonded to the substrate, a second interposer bonded to the substrate, a bridge component electrically connecting the first interposer to the second interposer, two or more first dies bonded to the first interposer; and two or more second dies bonded to the second interposer.

20 Claims, 8 Drawing Sheets

(56) References Cited

U.S. PATENT DOCUMENTS

| | | |
|---|---|---|
| 2011/0312129 A1 | 12/2011 | Joseph et al. |
| 2013/0270682 A1* | 10/2013 | Hu .................. H01L 25/50 |
| | | 257/E21.705 |
| 2014/0061946 A1 | 3/2014 | Zhao et al. |
| 2014/0174807 A1 | 6/2014 | Roy et al. |
| 2014/0360767 A1 | 12/2014 | Terui et al. |
| 2015/0048515 A1 | 2/2015 | Zhang et al. |
| 2015/0303174 A1* | 10/2015 | Yu .................... H01L 24/20 |
| | | 438/109 |
| 2016/0085899 A1 | 3/2016 | Qian et al. |
| 2017/0323866 A1 | 11/2017 | Shih |
| 2019/0096851 A1 | 3/2019 | Liao et al. |
| 2019/0238134 A1 | 8/2019 | Lee et al. |
| 2019/0295952 A1 | 9/2019 | Sikka et al. |
| 2020/0006307 A1* | 1/2020 | Tsai .................. H01L 23/3114 |
| 2020/0023449 A1 | 1/2020 | Verbiscus |
| 2020/0266149 A1* | 8/2020 | Xu .................... H01L 21/56 |
| 2020/0381361 A1 | 12/2020 | Zhao et al. |
| 2020/0411407 A1 | 12/2020 | Dubey et al. |
| 2021/0044030 A1 | 2/2021 | Aleksov et al. |

\* cited by examiner

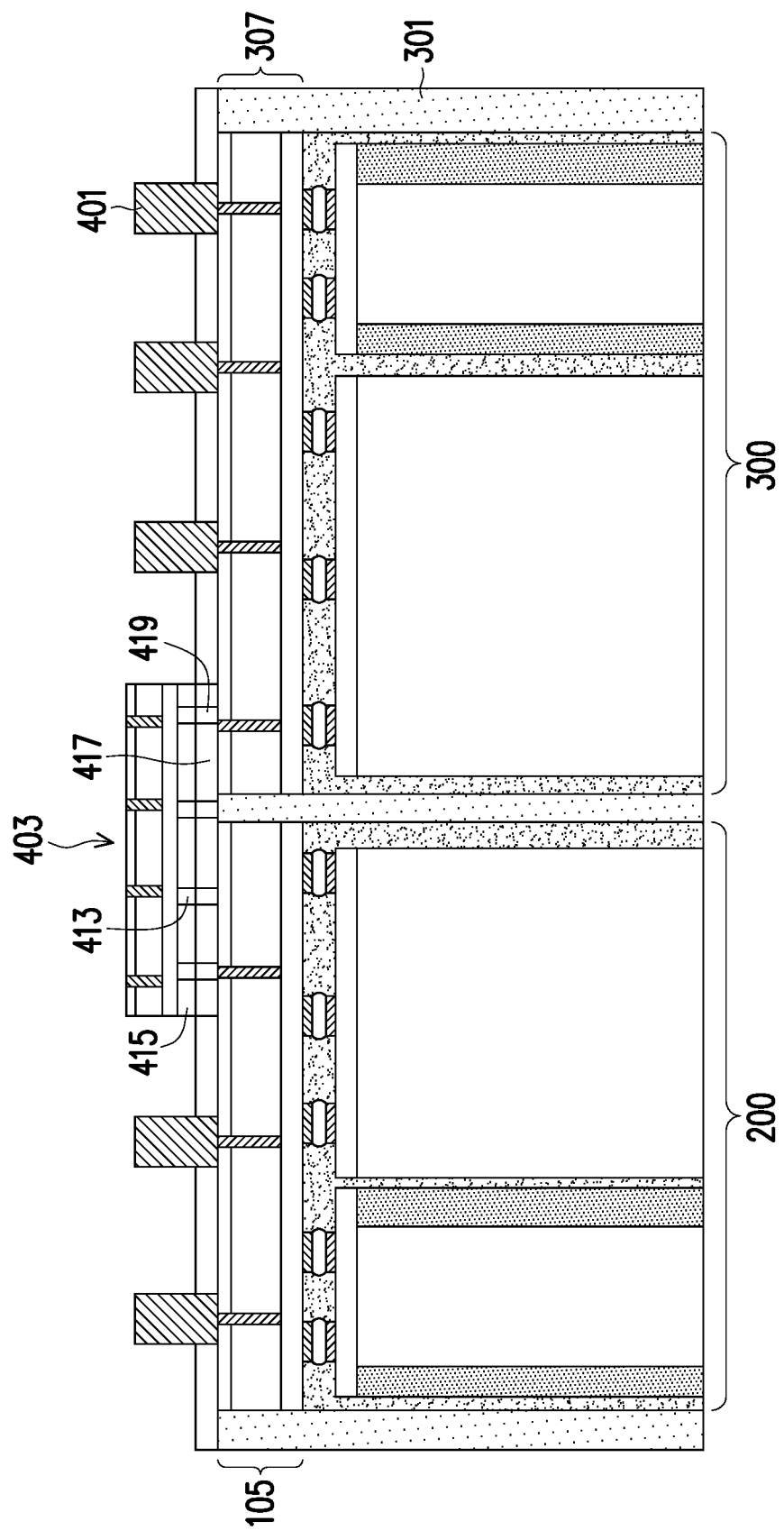

SEMICONDUCTOR DEVICES AND METHODS OF MANUFACTURE

PRIORITY CLAIM AND CROSS-REFERENCE

This application is a divisional of U.S. patent application Ser. No. 16/887,458, filed on May 29, 2020, which claims the benefit of U.S. Provisional Application No. 62/884,517, filed on Aug. 8, 2019, which are hereby incorporated by reference.

BACKGROUND

As semiconductor integrated circuits become smaller and smaller in two dimensions, increased attention has been focused on connecting multiple functional dies together through the use of interposers. One particular embodiment includes a system such as a chip-on-wafer-on-substrate (CoWoS) system, in which dies are attached to a wafer and then attached to a substrate. However, as devices get smaller and smaller, additional problems need to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4B illustrate bonding bridge components, in accordance with some embodiments.

DETAILED DESCRIPTION

Figure 1:
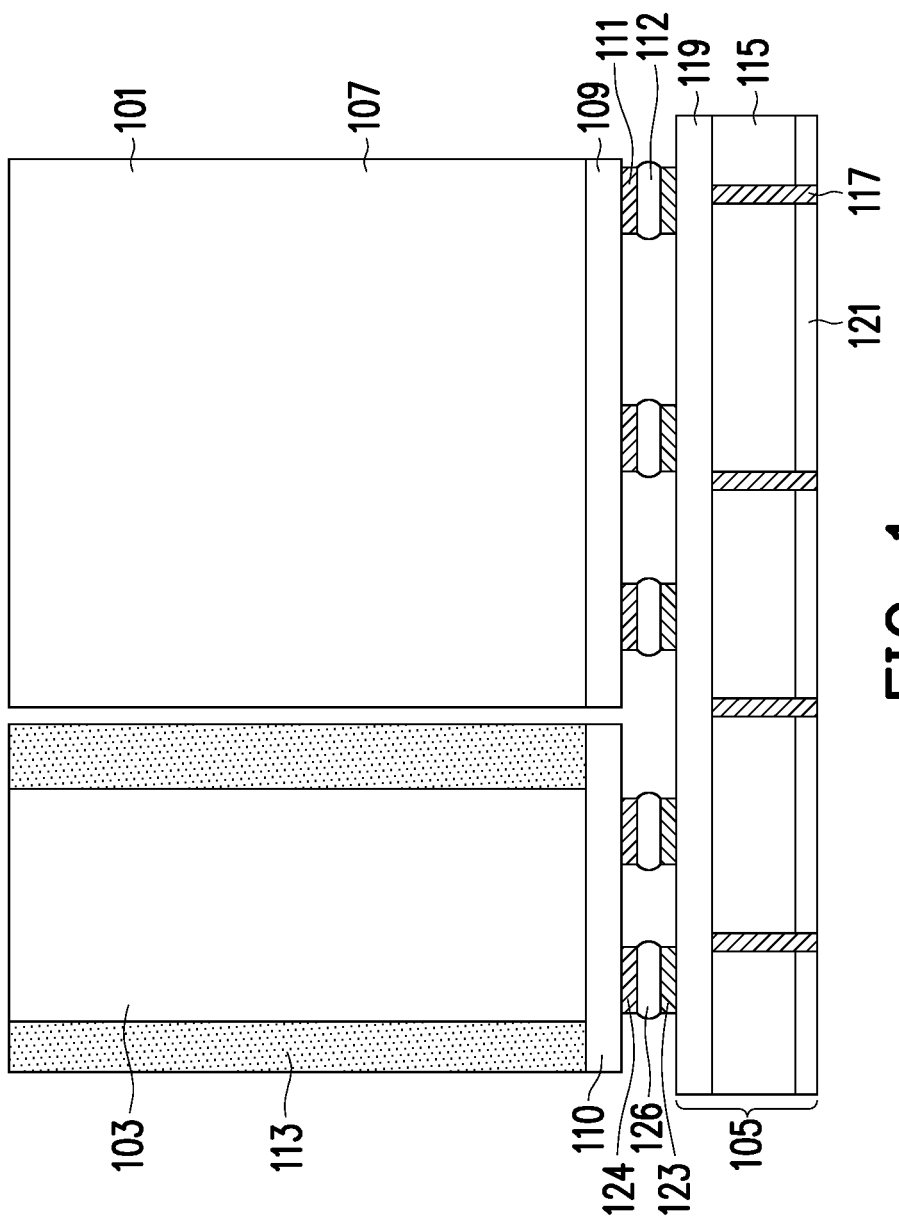
FIG. 1 illustrates bonding a first semiconductor device to a first interposer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular structures in which multiple chip on wafer structures are partitioned and then connected using bridge components on a molded platform. However, these embodiments are intended to be illustrative and are not intended to be limiting, as the ideas presented herein may be implemented in a wide variety of structures and methods.

With reference now to FIG. 1, there is illustrated a first semiconductor die 101 and a second semiconductor die 103 attached to a first interposer 105. In an embodiment the first semiconductor die 101 and the second semiconductor die 103 may be semiconductor devices such as logic dies, DRAM dies, SRAM dies, central processing unit dies, I/O dies, combinations of these, or the like. Additionally, while the first semiconductor die 101 and the second semiconductor die 103 may be the same type of device (e.g., both be DRAM dies), they may also be different types of dies (e.g., the first semiconductor die 101 may be a logic die and the second semiconductor die 103 may be a DRAM die such as a high bandwidth memory (HBM) die). The first semiconductor die 101 and the second semiconductor die 103 may also comprise a stack of multiple dies. Any suitable combination of semiconductor dies, and any number of semiconductor dies, may be utilized, and all such numbers, combinations, and functionalities are fully intended to be included within the scope of the embodiments.

The first semiconductor die 101 may comprise a first substrate 107, first active devices on the first substrate 107 (not individually illustrated), first metallization layers (not separately illustrated in FIG. 1), a first passivation layer 109, and first external contacts 111 (illustrated in FIG. 1 as already bonded to fourth external contacts 123, discussed further below). In an embodiment the first substrate 107 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor die 101. The first active devices may be formed using any suitable methods either within or else on the first substrate 107.

The first metallization layers are formed over the first substrate 107 and the first active devices and are designed to connect the various first active devices to form functional circuitry. In an embodiment the first metallization layers are formed of alternating layers of dielectric and conductive material and may be formed through any suitable process (such as deposition, damascene, dual damascene, etc.). In an embodiment there may be four layers of metallization separated from the first substrate 107 by at least one interlayer dielectric layer (ILD), but the precise number of first metallization layers is dependent upon the design of the first semiconductor die 101.

The first passivation layer 109 may be formed over the first metallization layers in order to provide a degree of protection for the underlying structures. The first passivation layer 109 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 109 may be formed through a process such as chemical vapor deposition (CVD), although any suitable process may be utilized, and may have a thickness between about 0.5 µm and about 5 µm.

The first external contacts 111 may be formed through the first passivation layer 109 to provide conductive regions for contact between the first metallization layers and, e.g., the fourth external contacts 123 (illustrated in FIG. 1 as already bonded to the first external contacts 111) that are on the first interposer 105. In an embodiment the first external contacts 111 may be a conductive pillar, such as a copper pillar. In such an embodiment the conductive pillar may be formed by initially forming a photoresist (not shown) over the first passivation layer 109 to a thickness between about 5 µm to about 20 µm, such as about 10 µm. The photoresist may be patterned to expose portions of the first passivation layer 109 through which the conductive pillars will extend. Once patterned, the photoresist may then be used as a mask to remove the desired portions of the first passivation layer 109, thereby exposing those portions of the underlying first metallization layers to which the first external contacts 111 will make contact.

The first external contacts 111 may be formed within the openings of both the first passivation layer 109 and the photoresist. The first external contacts 111 may be formed from a conductive material such as copper, although other conductive materials such as nickel, gold, or metal alloy, combinations of these, or the like may also be used. Additionally, the first external contacts 111 may be formed using a process such as electroplating, by which an electric current is run through the conductive portions of the first metallization layers to which the first external contacts 111 are desired to be formed, and the first metallization layers are immersed in a solution. The solution and the electric current deposit, e.g., copper, within the openings in order to fill and/or overfill the openings of the photoresist and the first passivation layer 109, thereby forming the first external contacts 111. Excess conductive material may then be removed using, for example, a chemical mechanical polish (CMP) process, an etching process, combinations of these, or the like, and the photoresist may be removed through, e.g., an ashing process.

However, as one of ordinary skill in the art will recognize, the above described processes to form the first external contacts 111 are merely descriptions, and are not meant to limit the embodiments to these exact processes. Rather, the described processes are intended to be illustrative, as any suitable process for forming the first external contacts 111 may be utilized. All suitable processes are fully intended to be included within the scope of the present embodiments.

Additionally, if desired, the first external contacts 111 may be capped with first contact bumps 112. In an embodiment the first contact bumps 112 may be contact bumps such as microbumps and may comprise a material such as tin, or other suitable materials, such as silver or copper. In an embodiment in which the first contact bumps 112 are tin solder bumps, the first contact bumps 112 may be formed by initially forming a layer of tin through any suitable method such as evaporation, electroplating, printing, solder transfer, ball placement. Once a layer of tin has been formed on the structure, a reflow is performed in order to shape the material into the desired bump shape.

However, as one of ordinary skill in the art will recognize, while the first external contacts have been described above as copper pillars capped with microbumps, these are merely intended to be illustrative and are not intended to limit the embodiments. Rather, any suitable type of external contacts, such as controlled collapse chip connection (C4) bumps, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the first external contacts 111, and all such external connectors are fully intended to be included within the scope of the embodiments.

Looking next at the second semiconductor die 103, the second semiconductor die 103 may comprise a second substrate, second active devices (not individually illustrated in FIG. 1), second metallization layers (also not individually illustrated in FIG. 1), a second passivation layer, and second external contacts. In an embodiment the second substrate, the second active devices, the second metallization layers, the second passivation layer, and the second external contacts may be similar to the first substrate 107, the first active devices, the first metallization layers, the first passivation layer 109, and the first external contacts 111, respectively, although they may alternatively be different materials formed from different processes. For example, the precise placement and formation of the various devices and layers will be dependent at least in part on the desired functionality of the second semiconductor die 103.

Optionally, instead of directly bonding the second semiconductor die 103 to the first interposer 105, the second semiconductor die 103 may instead be bonded to an interface 110 by way of chip side interface bonds using, e.g., the second external contacts. In an embodiment, the interface 110 may include a series of alternating layers of conductive materials (such as copper, aluminum, alloys, doped polysilicon, combinations thereof, or the like) to form interconnections between the second semiconductor die 103 and the first interposer 105.

In an embodiment the second semiconductor die 103 may be bonded to the interface 110 using the second external contacts while the interface 110 is still part of a wafer. In an embodiment in which the second external contacts are copper pillars capped with contact bumps, the copper pillars may be aligned with similar contacts on the interface 110 and a reflow process process may be used to bond the second external contacts with the interface 110. However, any suitable process may be utilized to bond the second semiconductor die 103 to the interface 110.

On an opposite side of the second semiconductor die 103, the interface 110 may also comprise third external contacts 124 capped with second contact bumps 126. In an embodiment the third external contacts 124 and the second contact bumps 126 may be similar to the first external contacts 111 and the first contact bumps 112 described above, such as by being conductive pillars capped with contact bumps. However, any suitable materials and methods of manufacture may be utilized to form the third external contacts 124 and the second contact bumps 126.

Additionally, in embodiments in which the second semiconductor die 103 is utilized with the interface 110 and in which the interface has a different dimension from the second semiconductor die 103, the second semiconductor die 103 may be encapsulated with a first encapsulant 113. The encapsulation may be performed in a molding device, which may comprise a top molding portion and a bottom molding portion separable from the top molding portion. When the top molding portion is lowered to be adjacent to the bottom molding portion, a molding cavity may be formed for the interface 110 and the second semiconductor die 103.

During the encapsulation process the top molding portion may be placed adjacent to the bottom molding portion, thereby enclosing the interface 110 and the second semiconductor die 103 within the molding cavity. Once enclosed, the top molding portion and the bottom molding portion may form an airtight seal in order to control the influx and outflux of gasses from the molding cavity. Once sealed, the first encapsulant 113 may be placed within the molding cavity.

The first encapsulant 113 may be an epoxy or a molding compound resin such as polyimide, PPS, PEEK, PES, a heat resistant crystal resin, combinations of these, or the like. The first encapsulant 113 may be placed within the molding cavity prior to the alignment of the top molding portion and the bottom molding portion, or else may be injected into the molding cavity through an injection port, using compression molding, transfer molding, or the like.

Once the first encapsulant 113 has been placed into the molding cavity such that the first encapsulant 113 encapsulates the second semiconductor die 103, the first encapsulant 113 may be cured in order to harden the encapsulant for optimum protection. While the exact curing process is dependent at least in part on the particular material chosen for the first encapsulant 113, in an embodiment in which molding compound is chosen as the first encapsulant 113, the curing could occur through a process such as heating the first encapsulant 113 to between about 100° C. and about 130° C., such as about 125° C. for about 60 sec to about 3000 sec, such as about 600 sec. Additionally, initiators and/or catalysts may be included within the first encapsulant 113 to better control the curing process.

However, as one having ordinary skill in the art will recognize, the curing process described above is merely an exemplary process and is not meant to limit the current embodiments. Other curing processes, such as irradiation or even allowing the encapsulant to harden at ambient temperature, may also be used. Any suitable curing process may be used, and all such processes are fully intended to be included within the scope of the embodiments discussed herein.

Once the first encapsulant 113 has been placed and cured, the first encapsulant 113 may be thinned. In an embodiment the thinning may be performed, e.g., using a mechanical grinding or chemical mechanical polishing (CMP) process whereby chemical etchants and abrasives are utilized to react and grind away the first encapsulant 113 so that the second semiconductor die 103 has been exposed. As such, the second semiconductor die 103 may have a planar surface that is also planar with the first encapsulant 113.

Looking next at the first interposer 105, the first interposer 105 may comprise an interposer substrate 115 with through substrate vias (TSVs) 117. In this embodiment the interposer substrate 115 may be, e.g., a silicon substrate, doped or undoped, or an active layer of a silicon-on-insulator (SOI) substrate. However, the interposer substrate 115 may also be a glass substrate, a ceramic substrate, a polymer substrate, or any other substrate that may provide a suitable protection and/or interconnection functionality. These and any other suitable materials may alternatively be used for the interposer substrate 115.

In some embodiments, the interposer substrate 115 may include electrical elements, such as resistors, capacitors, signal distribution circuitry, combinations of these, or the like. These electrical elements may be active, passive, or a combination thereof. In other embodiments, the interposer substrate 115 is free from both active and passive electrical elements therein. All such combinations are fully intended to be included within the scope of the embodiments.

Additionally, in some embodiments the interposer substrate 115 is a semiconductor wafer, such as a twelve inch semiconductor wafer, at this stage in the manufacturing process. For example, the first interposer 105 may extend beyond the boundaries illustrated in FIG. 1 to include additional portions that will also comprise TSVs for manufacturing additional structures. As such, when the first semiconductor die 101 and the second semiconductor die 103 are bonded to the first interposer 105, the combined structure will be in a chip on wafer (CoW) configuration.

The TSVs 117 may be formed by initially forming TSV conductors partially through the interposer substrate 115. The TSV conductors may be formed by applying and developing a suitable photoresist to the interposer substrate 115 and then etching the interposer substrate 115 to generate TSV openings (filled later as discussed below). The openings for the TSV conductors at this stage may be formed so as to extend into the interposer substrate 115 to a depth at least greater than the eventual desired height of the finished interposer substrate 115. Accordingly, while the depth is dependent upon the overall design of the first interposer 105, the depth may be between about 1 μm and about 700 μm below the surface on the interposer substrate 115, with a depth of about 50 μm. The openings for the TSV conductors may be formed to have a diameter of between about 1 μm and about 100 μm, such as about 6 μm.

Once the openings for the TSV conductors have been formed, the openings for the TSV conductors may be filled with, e.g., a liner (not separately illustrated in FIG. 1), a barrier layer (also not separately illustrated in FIG. 1), and a conductive material. In an embodiment the liner may be a dielectric material such as silicon nitride, silicon oxide, a dielectric polymer, combinations of these, or the like, formed by a process such as chemical vapor deposition, oxidation, physical vapor deposition, atomic layer deposition, or the like.

The barrier layer may comprise a conductive material such as titanium nitride, although other materials, such as tantalum nitride, titanium, another dielectric, or the like may alternatively be utilized. The barrier layer may be formed using a CVD process, such as PECVD. However, other alternative processes, such as sputtering or metal organic chemical vapor deposition (MOCVD), atomic layer deposition (ALD), may alternatively be used. The barrier layer may be formed so as to contour to the underlying shape of the opening for the TSV conductors.

The conductive material may comprise copper, although other suitable materials such as aluminum, tungsten, alloys, doped polysilicon, combinations thereof, and the like, may alternatively be utilized. The conductive material may be formed by depositing a seed layer and then electroplating copper onto the seed layer, filling and overfilling the openings for the TSV conductors. Once the openings for the TSV conductors have been filled, excess barrier layer and excess conductive material outside of the openings for the TSV conductors may be removed through a grinding process such as chemical mechanical polishing (CMP), although any suitable removal process may be used.

Once the TSV conductors have been formed, a first redistribution layer 119 may be formed on a first side of the interposer substrate 115 in order to provide interconnectivity between the TSV conductors, the fourth external contacts 123, and the first semiconductor die 101 and the second semiconductor die 103. The first redistribution layer 119 may be formed using common methods for forming interconnect lines in integrated circuits. In an embodiment the first redistribution layer 119 comprises at least one conductive layer formed of a metal such as copper, aluminum, tungsten, titanium, and combinations thereof. The at least one conductive layer may be formed by forming a seed layer, covering the seed layer with a patterned photoresist (not illustrated), and then plating the metal on the seed layer within the openings of the photoresist. Once completed, the photoresist and portions of the seed layer underlying the photoresist are removed, leaving the at least one conductive layer, which may have a thickness of between about 2 µm and about 30 µm, with a width of about 5 µm.

As one of skill in the art will recognize, the conductive layer could be a single layer of conductive material or else could alternatively be multiple layers of conductive material, depending upon the properties desired. For example, the conductive layer of the first redistribution layer 119 as formed above may be plated with another conductive material such as gold or chromium to provide good adhesion for a subsequently formed connector (described below). This plating could be done through a process such as CVD.

After the conductive layer of the first redistribution layer 119 has been formed, a passivation layer may be formed over the conductive layer of the first redistribution layer 119, and vias may be formed through the dielectric material to provide electrical access to the conductive layer of the first redistribution layer 119. In an embodiment the passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized, and may have a thickness between about 0.5 µm and about 5 µm.

If desired, the process of forming the conductive layer of the first redistribution layer 119 and the passivation layer of the first redistribution layer 119 may be repeated to form another layer of the first redistribution layer 119. This process may be repeated as many times desired to form any suitable number of layers for the first redistribution layer 119.

Once the conductive layer of the first redistribution layer 119 and the passivation layer of the first redistribution layer 119 have been formed, the fourth external contacts 123 may be formed in electrical connection with the first redistribution layer 119 on the first side of the first interposer 105. In an embodiment the fourth external contacts 123 may be similar to the first external contacts 111 and the second external contacts, such as by being conductive pillars capped with contact bumps. However, any suitable type of external contacts, and any other suitable process of formation, may alternatively be used, and all such types and processes are fully intended to be included within the scope of the embodiments.

FIG. 1 additionally illustrates a thinning of a second side of the interposer substrate 115 in order to expose the openings for the TSVs and form the TSVs 117 from the conductive material that extends through the interposer substrate 115. In an embodiment, the thinning of the second side of the interposer substrate 115 may leave the TSVs 117 exposed. The thinning of the second side of the interposer substrate 115 may be performed by a planarization process such as CMP or etching.

Additionally, if desired, the back side of the interposer substrate 115 may then be recessed to allow the TSVs 117 to protrude from the back side of the interposer substrate 115. In an embodiment the recessing may be performed using an etching process, such as a dry etching process, although any suitable process may be utilized. In an embodiment the TSVs 117 may protrude from the back side of the interposer substrate 115 a distance of between about 0.5 µm and about 10 µm, such as about 5 µm.

Once the TSVs 117 protrude from the interposer substrate 115, a passivation layer 121 may be formed in order to protect the TSVs 117. In an embodiment the passivation layer 121 may be made of one or more suitable dielectric materials such as silicon oxide, silicon nitride, a polymer such as polybenzoxazole (PBO), a molding compound, a low-k dielectric such as carbon doped oxides, extremely low-k dielectrics such as porous carbon doped silicon dioxide, combinations of these, or the like. The passivation layer 121 may be formed through a low temperature chemical vapor deposition (LTCVD), although any suitable deposition process, such as CVD, PVD, ALD, a molding process, combinations of these, or the like, may also be utilized. After the passivation layer 121 has been formed, the passivation layer 121 may also be thinned in order to again expose the TSVs 117. In an embodiment a chemical mechanical polishing process may be used to thin the passivation layer 121 until the TSVs 117 have been exposed.

Optionally, once the interposer substrate 115 has been thinned, a second redistribution layer can be formed on the second side of the interposer substrate 115 and in electrical connection with the TSVs 117. In an embodiment the second redistribution layer may be similar to the first redistribution layer 119 and may be formed in a similar fashion. However, any suitable process may be utilized.

Once ready, the first semiconductor die 101 and the second semiconductor die 103 may be bonded to the first interposer 105 using, e.g., a bonding process. In an embodiment in which the first external contacts 111, the third external contacts 124 and the fourth external contacts 123 are copper pillars capped by either the first contact bumps 112 or the second contact bumps 126, the bonding process may be performed by first aligning the first external contacts 111 and the third external contacts 124 with respective ones of the fourth external contacts 123. Once in contact, a reflow process may then be performed in order to reflow the first contact bumps 112 and the second contact bumps 126, thereby bonding the first external contacts 111 and the third external contacts 124 with the fourth external contacts 123.

Figure 2:
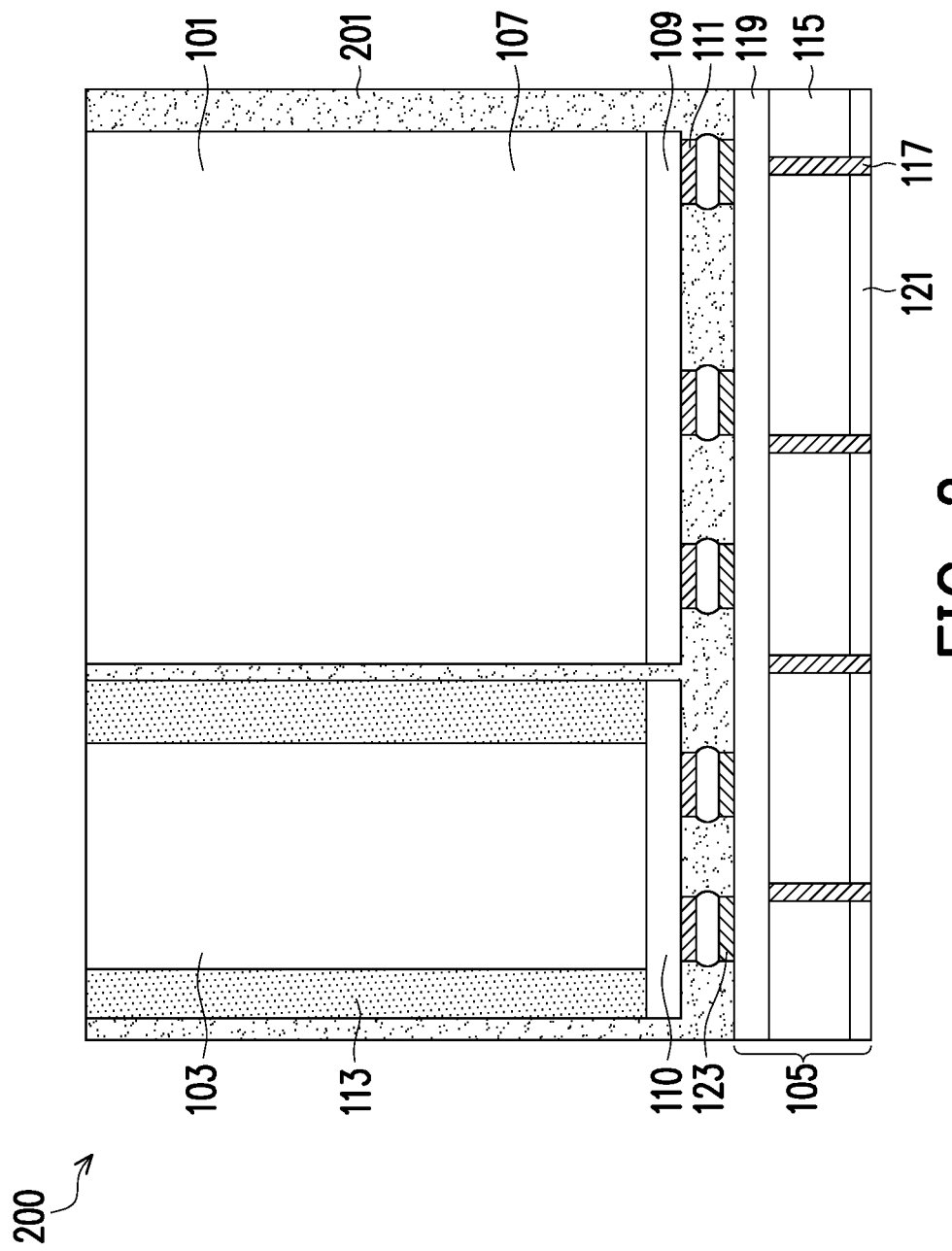
FIG. 2 illustrates a first encapsulation, in accordance with some embodiments.

FIG. 2 illustrates that, once the first semiconductor die 101 and the second semiconductor die 103 have been bonded to the first interposer 105, the first semiconductor die 101 and the second semiconductor die 103 may be encapsulated using, e.g., a second encapsulant 201. In an embodiment the first semiconductor die 101 and the second semiconductor die 103 may be encapsulated as described above with respect to the first encapsulant 113 (see, e.g., FIG. 1). For example, the first semiconductor die 101 and the second semiconductor die 103 may be placed in a molding chamber, the second encapsulant 201 is placed around the first semiconductor die 101 and the second semiconductor die 103, the second encapsulant 201 is optionally cured, and then the second encapsulant 201 is planarized to expose the first semiconductor die 101, the second semiconductor die 103, and the first encapsulant 113. However, any suitable process and any suitable materials can be utilized.

If desired, the interposer substrate 115 may be singulated after bonding and encapsulation to form a first chip on wafer structure 200. In an embodiment the interposer substrate 115 is singulated using, e.g., a die saw, a laser, one or more etching processes, or other device in order to separate the interposer substrate 115. However, any suitable process for separating the interposer substrate 115 may be used.

Figure 3:
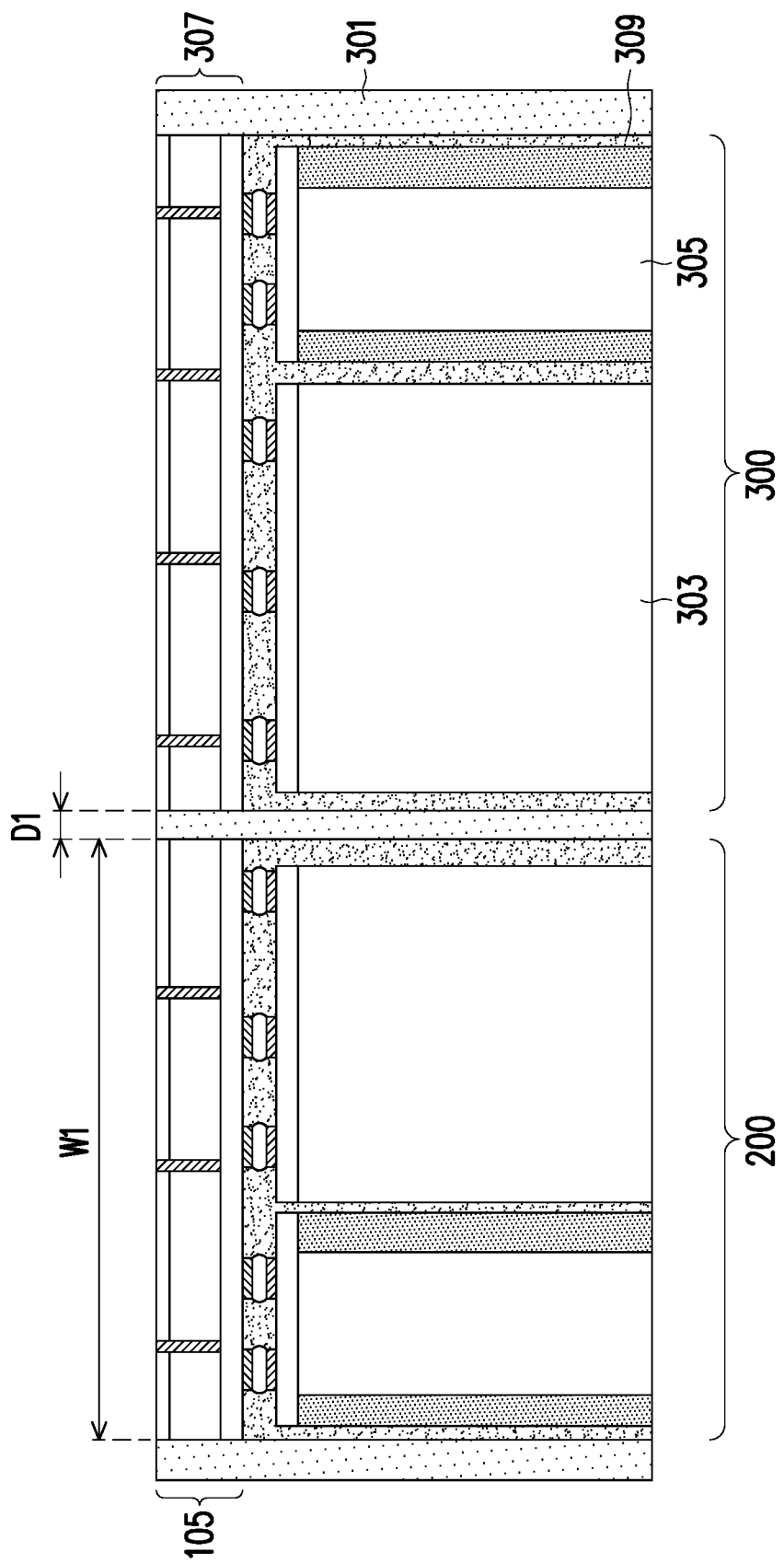
FIG. 3 illustrates a second encapsulation, in accordance with some embodiments.

FIG. 3 illustrates that, once the first chip on wafer structure 200 is singulated, the first chip on wafer structure 200 is encapsulated together with a second chip on wafer structure 300 using, e.g., a third encapsulant 301. In an embodiment the second chip on wafer structure 300 may comprise a third semiconductor device 303 and a fourth semiconductor device 305 bonded to a second interposer 307 and encapsulated with a fourth encapsulant 309. In an embodiment the third semiconductor device 303 may be similar to the first semiconductor die 101, the fourth semiconductor device 305 may be similar to the second semiconductor die 103 (including, if desired, being bonded to an interface), the second interposer 307 may be similar to the first interposer 105, and the fourth encapsulant 309 may be similar to the second encapsulant 201.

Additionally, the device within the second chip on wafer structure 300 (e.g., the third semiconductor device 303 and the fourth semiconductor device 305) are designed to work at least partially in conjunction with the devices within the first chip on wafer structure 200 (e.g., the first semiconductor die 101 and the second semiconductor die 103). As such, while the third semiconductor device 303 and the fourth semiconductor device 305 may be similar to the first semiconductor die 101 and the second semiconductor die 103, in other embodiments they are different so as to provide complementary functionalities. Any suitable combination of devices and functionalities may be provided, and all such combinations are fully intended to be included within the scope of the embodiments.

In an embodiment the first chip on wafer structure 200 and the second chip on wafer structure 300 may be encapsulated as described above with respect to the first encapsulant 113. For example, the first chip on wafer structure 200 and the second chip on wafer structure 300 may be placed in a molding chamber (on, e.g., a carrier substrate (not shown)), the third encapsulant 301 is placed around and between the first chip on wafer structure 200 and the second chip on wafer structure 300, the third encapsulant 301 is optionally cured, and then the third encapsulant 301 is planarized to expose the first chip on wafer structure 200 and the second chip on wafer structure 300. However, any suitable process and any suitable materials can be utilized.

In an embodiment the first chip on wafer structure 200 and the second chip on wafer structure 300 may be sized and placed in order to reduce the footprint of the overall device and also so that a production-friendly set of photolithographic masks can be used to help manufacture the first interposer 105 and the second interposer 307 (and avoid stitching patterns together). In a particular embodiment each of the first chip on wafer structure 200 and the second chip on wafer structure 300 may have a first width W1 of between about 12 mm and about 64 mm, such as about 37 mm, while each of the first chip on wafer structure 200 and the second chip on wafer structure 300 may have a first length (not separately illustrated in FIG. 3 because it extends into and out of the figure) of between about 12 mm and about 64 mm, such as about 47 mm. Additionally, the first chip on wafer structure 200 and the second chip on wafer structure 300 may be placed a first distance D1 of between about 2.5 mm and about 0.04 mm, such as about 0.07 mm, apart from each other. However, these dimensions are intended to be illustrative, and any suitable dimensions or combination of dimensions (in embodiments in which the first chip on wafer structure 200 has different dimensions than the second chip on wafer structure 300) may be utilized.

Additionally, while only the first chip on wafer structure 200 and the second chip on wafer structure 300 are illustrated in FIG. 3, this is intended to be illustrative and is not intended to be limiting. Rather, any suitable number of structures may be utilized, such as three, four, or more of the structures. All such number of structures are fully intended to be included within the scope of the embodiments.

Figure 4A:
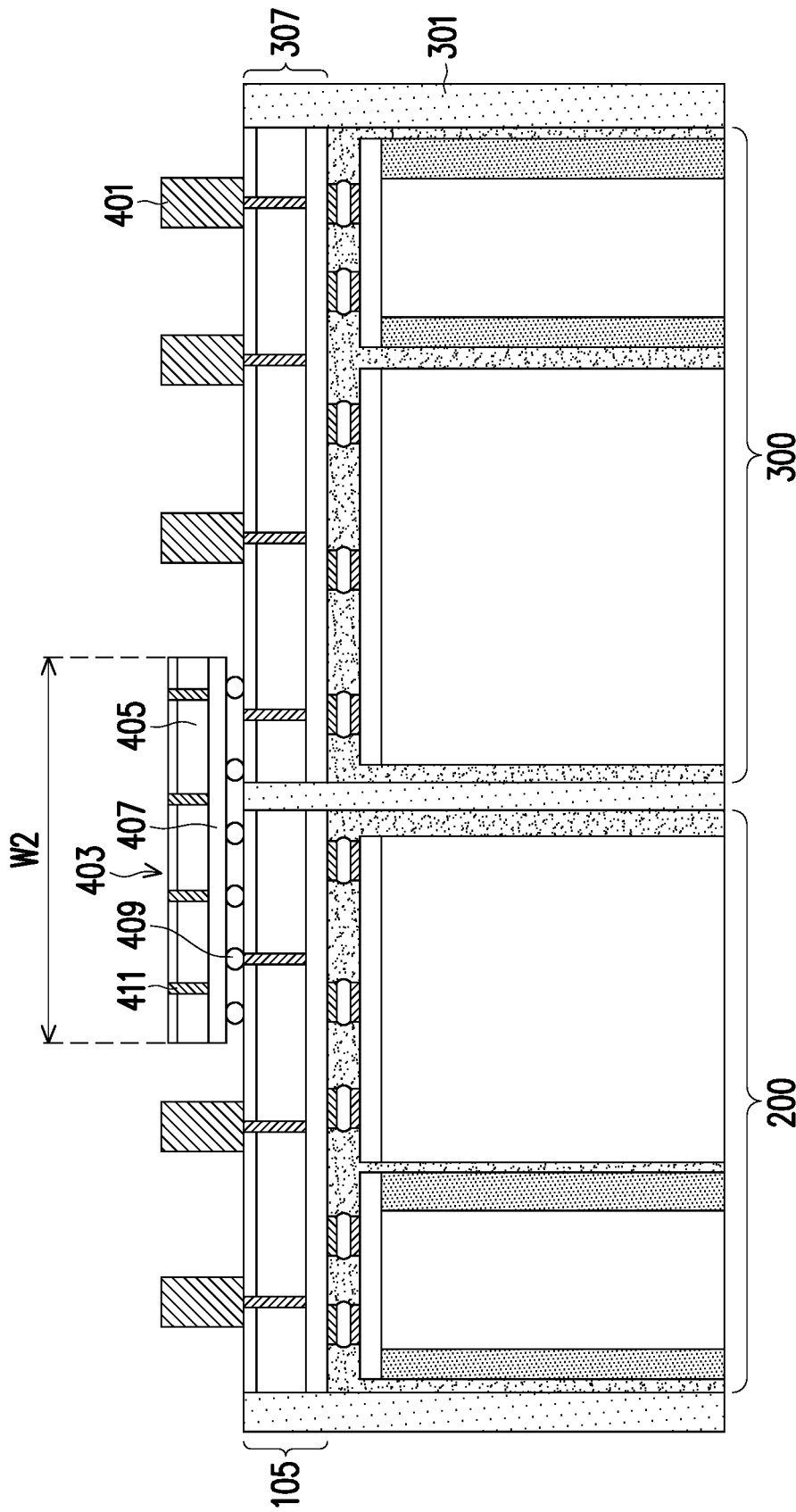

FIG. 4A illustrates that, once the first chip on wafer structure 200 and the second chip on wafer structure 300 have been encapsulated using the third encapsulant 301, through integrated fan out vias (TIVs) 401 may be formed in electrical connection with the first interposer 105 and the second interposer 307 and a bridge component 403 may be placed to interconnect the first chip on wafer structure 200 with the second chip on wafer structure 300. In an embodiment the TIVs 401 may be formed by initially forming a seed layer over the first chip on wafer structure 200, the second chip on wafer structure 300 and the third encapsulant 301. In an embodiment the seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as sputtering, evaporation, or PECVD processes, depending upon the desired materials. The seed layer may be formed to have a thickness of between about 0.3 µm and about 1 µm, such as about 0.5 µm.

Once the seed layer is formed, a photoresist is placed over the seed layer. In an embodiment the photoresist may be placed on the seed layer using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the TIVs 401. The TIVs 401 are formed in such a placement as to be located on different sides of subsequently attached devices such as the bridge components 403. However, any suitable arrangement for the pattern of the TIVs 401 may be utilized.

In an embodiment the TIVs 401 are formed within the photoresist and comprise one or more conductive materials, such as copper, tungsten, other conductive metals, or the like, and may be formed, for example, by electroplating, electroless plating, or the like. In an embodiment, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the TIVs 401 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the seed layer.

Once exposed removal of the exposed portions of the seed layer may be performed. In an embodiment the exposed portions of the seed layer (e.g., those portions that are not covered by the TIVs 401) may be removed by, for example, a wet or dry etching process. For example, in a dry etching process reactants may be directed towards the seed layer using the TIVs 401 as masks. In another embodiment, etchants may be sprayed or otherwise put into contact with the seed layer in order to remove the exposed portions of the seed layer.

After the TIVs 401 have been formed, the bridge components 403 may be placed adjacent to the TIVs 401 in order to connect the first chip on wafer structure 200 with the second chip on wafer structure 300. In order to interconnect the first chip on wafer structure 200 with the second chip on wafer structure 300, the bridge components 403 have electrical connections to route signals in both the horizontal and vertical directions.

In a particular embodiment the bridge component 403 may be a third interposer similar to the first interposer 105 (described above with respect to FIG. 1). For example, in this embodiment the bridge component 403 may comprise a bridge substrate 405 (which may be similar to the interposer substrate 115), one or more bridge redistribution layers 407 (similar to the first redistribution layer 119), and, optionally, one or more bridge through vias 411 may also be formed similar to the TSVs 117.

In an embodiment the bridge component 403 is sized in order to interconnect the first chip on wafer structure 200 and the second chip on wafer structure 300 while still being able to be located between the TIVs 401. In some embodiments the bridge component 403 may have a second width W2 of between about 2 mm and about 32 mm, such as about 5 mm, while also having a second length (not illustrated in FIG. 4A because the second length would extend into and out of the figure) of between about 12 mm and about 65 mm, such as about 47 mm. However, any suitable dimensions can be utilized.

Additionally, the bridge component 403 may also comprise fifth external contacts 409 connected to the one or more bridge redistribution layers 407. In an embodiment the fifth external contacts 409 may be similar to the first contact bumps 112, such as by being a conductive bump such as a solder bump. However, any other suitable external contact may be utilized to connect the bridge component 403 with the first interposer 105 and the second interposer 307.

In an embodiment in which the fifth external contacts 409 are conductive bumps, the bridge component 403 may be directly bonded to the first chip on wafer structure 200 and also to the second chip on wafer structure 300 by initially placing the fifth external contacts 409 in physical contact with both the first interposer 105 and the second interposer 307. In an embodiment the bridge component 403 may be placed using, e.g., a pick and place process. However, any other method of placing the bridge component 403 may be utilized.

Once the fifth external contacts 409 are placed in connection with the first chip on wafer structure 200 and also to the second chip on wafer structure 300, a reflow process may then be performed in order to reflow the fifth external contacts 409, thereby bonding the fifth external contacts 409 with the first interposer 105 and the second interposer 307.

FIG. 4B illustrates another embodiment in which the bridge component 403 is directly bonded to both the first chip on wafer structure 200 and also to the second chip on wafer structure 300 using a hybrid bond. In this embodiment, instead of the fifth external contacts 409 being conductive bumps, the bridge component 403 may comprise a first conductive wafer bond material 413 located within a first wafer bond layer 415. In accordance with some embodiments, the first wafer bond layer 415 is formed of a silicon-containing dielectric material such as silicon oxide, silicon nitride, or the like. The first wafer bond layer 415 may be deposited using any suitable method, such as, atomic layer deposition (ALD), CVD, high-density plasma chemical vapor deposition (HDPCVD), PVD, or the like to a thickness of between about 1 nm and about 1000 nm, such as about 5 nm. However, any suitable material, process, and thickness may be utilized.

Once the first wafer bond layer 415 has been formed, bond openings may be formed within the first wafer bond layer 415 to prepare for the formation of the first conductive wafer bond material 413. In an embodiment the bond openings may be formed by first applying and patterning a photoresist over the top surface of the first wafer bond layer 415. The photoresist is then used to etch the first wafer bond layer 415 in order to form the openings. The first wafer bond layer 415 may be etched by dry etching (e.g., reactive ion etching (RIE) or neutral beam etching (NBE)), wet etching, or the like.

Once the openings have been formed, the first conductive wafer bond material 413 may be formed. In an embodiment the first conductive wafer bond material 413 may comprise a barrier layer, a seed layer, a fill metal, or combinations thereof (not separately illustrated). The barrier layer may comprise titanium, titanium nitride, tantalum, tantalum nitride, or the like. The seed layer may be a conductive material such as copper and may be blanket deposited over the barrier layer using processes such as sputtering, evaporation, or plasma-enhanced chemical vapor deposition (PECVD), or the like, depending upon the desired materials. The fill metal may be a conductor such as copper or a copper alloy and may be deposited over the seed layer to fill or overfill the openings through a plating process such as electrical or electroless plating. Once the fill metal has been deposited, excess material of the fill metal, the seed layer, and the barrier layer may be removed from outside of the openings through a planarization process such as chemical mechanical polishing. However, while a single damascene process has been described, any suitable method, such as a dual damascene process, may also be utilized.

However, the above described embodiment in which the first wafer bond layer 415 is formed, patterned, and the first conductive wafer bond material 413 is plated into the opening before being planarized is intended to be illustrative and is not intended to be limiting upon the embodiments.

Rather, any suitable method of formation of the first wafer bond layer 415 and the first conductive wafer bond material 413 may be utilized. In other embodiments, the first conductive wafer bond material 413 may be formed first using, for example, a photolithographic patterning and plating process, and then dielectric material is used to gap fill the area around the first conductive wafer bond material 413 before being planarized using a CMP. Any such manufacturing process is fully intended to be included within the scope of the embodiments. Similarly, in this embodiment a second wafer bond layer 417 and a second conductive wafer bond material 419 are formed on each of the first chip on wafer structure 200 and the second chip on wafer structure 300.

Once the bond layers and conductive wafer bond materials have been formed, the bridge component 403 is bonded to the first chip on wafer structure 200 and the second chip on wafer structure 300 using, for example, hybrid bonding. In an embodiment the surfaces of the first wafer bond layer 415 and the first conductive wafer bond material 413 and the surfaces of the second wafer bond layer 417 and the second conductive wafer bond material 419 may be activated. This activation may comprise a dry treatment, a wet treatment, a plasma treatment, exposure to an inert gas plasma, exposure to $H_2$, exposure to $N_2$, exposure to $O_2$, or combinations thereof, as examples. In embodiments where a wet treatment is used, an RCA cleaning may be used, for example. In another embodiment, the activation process may comprise other types of treatments.

After the activation process, the bridge component 403 may be placed into contact with both the first chip on wafer structure 200 and the second chip on wafer structure 300. In a particular embodiment in which hybrid bonding is utilized, the first conductive wafer bond material 413 is placed into physical contact with the second conductive wafer bond material 419 while the first wafer bond layer 415 is placed into physical contact with the second wafer bond layer 417. With the activation process chemically modifying the surfaces, the bonding process between the materials begins upon the physical contact.

Once the bonding process has begun, the bonding may then be strengthened by subjecting the assembly to a thermal treatment. In an embodiment the bridge component 403 and the first chip on wafer structure 200 and the second chip on wafer structure 300 may be subjected to a low temperature between about 200° C. and about 400° C. to strengthen the bond between the first wafer bond layer 415 and the second wafer bond layer 417. The bridge component 403 and the first chip on wafer structure 200 and the second chip on wafer structure 300 may then be subjected to a temperature at or above the eutectic point for material of the first conductive wafer bond material 413 and the second conductive wafer bond material 419. In this manner, fusion of the bridge component 403 and the first chip on wafer structure 200 and the second chip on wafer structure 300 forms a hybrid bonded device.

Additionally, while specific processes have been described to initiate and strengthen the hybrid bonds between the bridge component 403 and the first chip on wafer structure 200 and the second chip on wafer structure 300, these descriptions are intended to be illustrative and are not intended to be limiting upon the embodiments. Rather, any suitable combination of baking, annealing, pressing, or other bonding processes or combination of processes may be utilized. All such processes are fully intended to be included within the scope of the embodiments.

Figure 5:
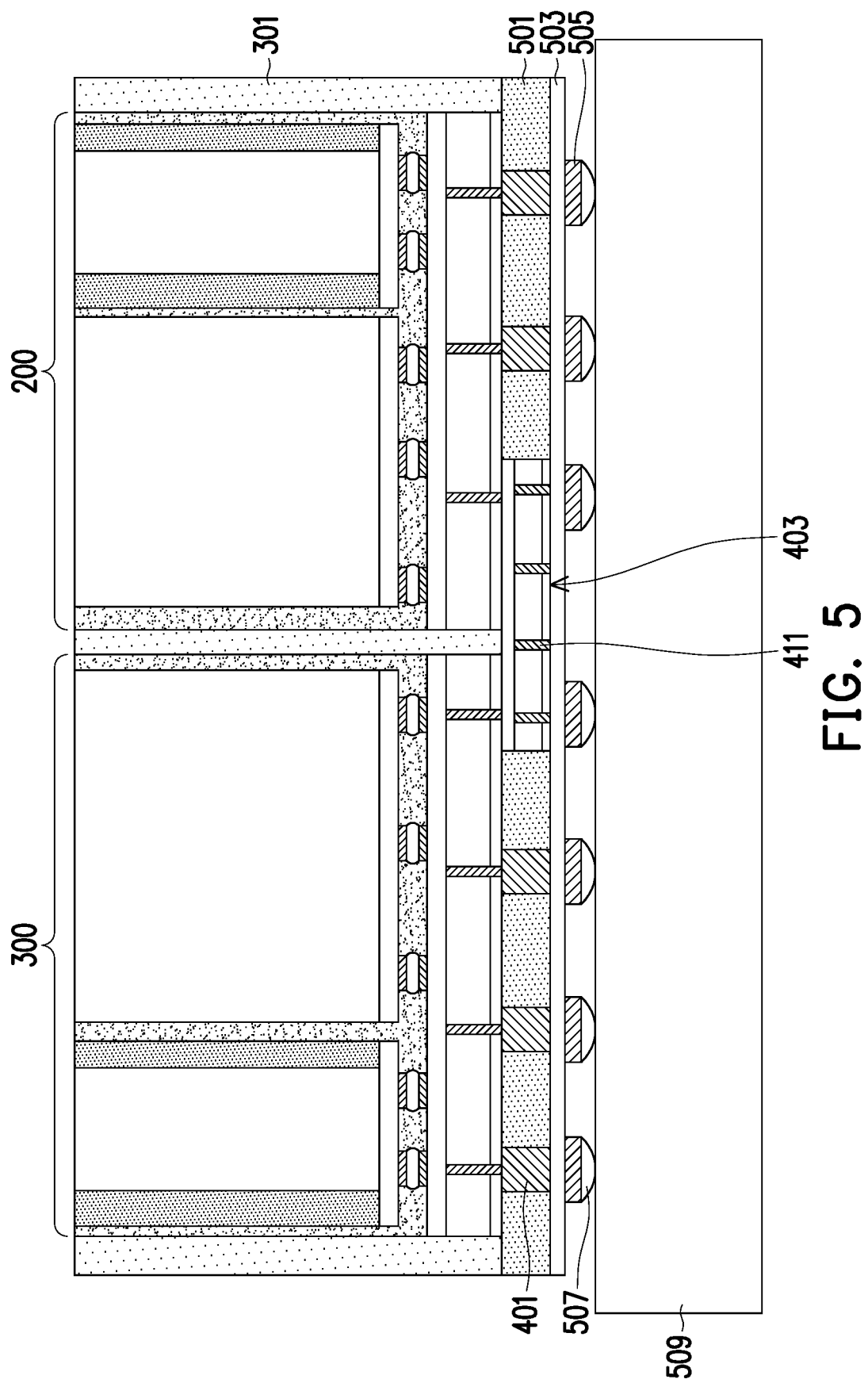
FIG. 5 illustrates a third encapsulation, in accordance with some embodiments.

FIG. 5 illustrates that, once the bridge component 403 has been connected and the TIVs 401 have been formed, the bridge component 403 and the TIVs 401 may be encapsulated with a fifth encapsulant 501. In an embodiment the bridge component 403 and the TIVs 401 may be encapsulated similar to the first encapsulant 113 described above with respect to FIG. 1. For example, the bridge component 403 and the TIVs 401 may be placed within a molding chamber and the fifth encapsulant 501 may be injected or otherwise placed within the molding chamber. Once in place, the fifth encapsulant 501 is cured and then planarized in order to expose at least the TIVs 401. However, any suitable methods and materials may be used to encapsulate the bridge component 403 and the TIVs 401.

Once the bridge component 403 has been used to interconnect the first chip on wafer structure 200 and the second chip on wafer structure 300 and the bridge component 403 and the TIVs 401 have been encapsulated, a third redistribution layer 503 may be formed to provide electrical connectivity to the TIVs 401. In an embodiment the third redistribution layer 503 may be formed similar to the first redistribution layer 119, described above with respect to FIG. 1. For example, conductive material may be deposited in a desired pattern and a dielectric material may be used to cover and isolate the conductive material, and this process may be repeated as many times as desired in order to form multiple conductive and dielectric layers.

Optionally, the bridge component 403 may also be electrically connected directly to the third redistribution layer 503. For example, in this embodiment the fifth encapsulant 501 may be planarized to expose the one or more bridge through vias 411, such that the fifth encapsulant 501, the TIVs 401, and the one or more bridge through vias 411 are planar with each other.

Once the one or more bridge through vias 411 are exposed, the third redistribution layer 503 may then be formed as described above. However, instead of only being electrically connected to the TIVs 401, the third redistribution layer 503 is also formed as being connected to the bridge component 403. As such, the bridge component 403 is electrically connected to each of the first chip on wafer structure 200, the second chip on wafer structure 300, and the third redistribution layer 503.

FIG. 5 additionally illustrates a formation of sixth external contacts 505 and third contact bumps 507 in electrical connection with the third redistribution layer 503. In an embodiment the sixth external contacts 505 and the third contact bumps 507 may be formed using materials and methods similar to the formation of the first external contacts 111 and the first contact bumps 112 described above with respect to FIG. 1. For example, the sixth external contacts 505 may be copper pillars and the third contact bumps 507 may be solder bumps. However, any suitable methods and materials may be utilized.

FIG. 5 additionally illustrates a bonding of the sixth external contacts 505 with a third substrate 509 to form a chip on wafer on substrate (CoWoS) structure. In an embodiment the third substrate 509 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may alternatively be utilized, and all such redistributive substrates that provide support and connectivity are fully intended to be included within the scope of the embodiments.

The third substrate 509 may be bonded to the sixth external contacts 505 by initially aligning the third substrate 509 with the sixth external contacts 505 and the third contact bumps 507. Once in physical contact, a reflow may be performed to reflow the third contact bumps 507 and bond the sixth external contacts 505 with the third substrate 509. However, any other suitable bonding may alternatively be utilized.

By utilizing the bridge component 403, the use of a single interposer to connect each of the devices (e.g., the first semiconductor die 101, the second semiconductor die 103, the third semiconductor device 303, and the fourth semiconductor device 305) may be avoided. In particular, partitioning the different devices onto different interposers (e.g., the first interposer 105 and the second interposer 307) and then integrating the different interposers with the bridge component into a molded platform, each of the problems associated with a single interposer can also be reduced or eliminated. For example, the stresses that are caused by a single large interposer can be reduced by using multiple smaller interposers. Also, issues associated with stitching when a single interposer is larger than a photolithographic mask can be avoided by using multiple smaller interposers. With these problems avoided, the overall process can become more reliable and lead to a larger yield.

Figure 6:
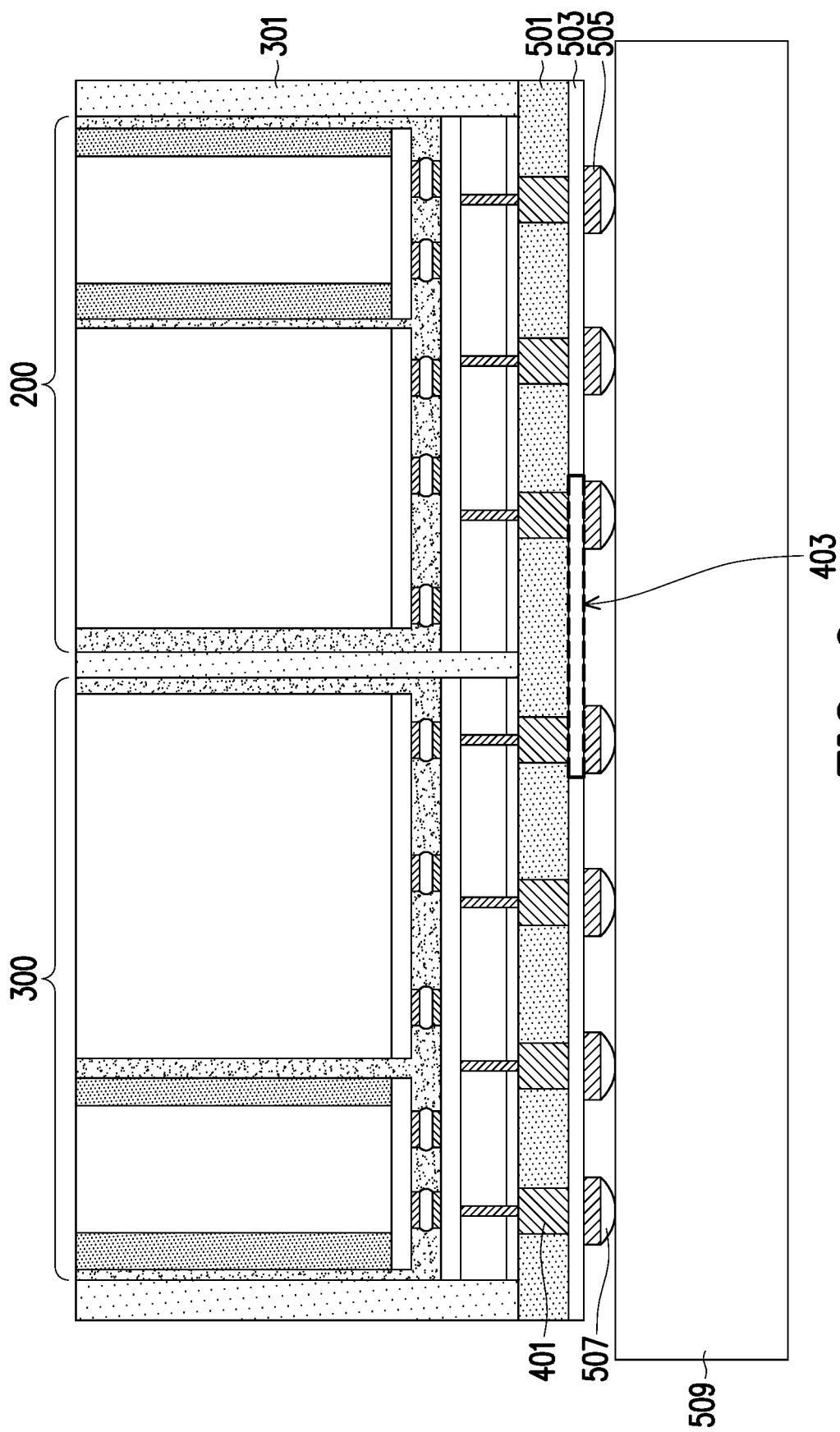
FIG. 6 illustrates the bridge components within a redistribution layer, in accordance with some embodiments.

FIG. 6 illustrates another embodiment in which the bridge components 403, instead of being a separate semiconductor device as described above with respect to FIGS. 4A-4B, is integrated as part of the third redistribution layer 503 and is indirectly connected to the first chip on wafer structure 200 and the second chip on wafer structure 300 through the TIVs 401. In this embodiment the bridge components 403 are formed simultaneously with the conductive and dielectric portions of the third redistribution layer 503. However, instead of solely interconnecting the TIVs 401 with the sixth external contacts 505, the bridge components 403 within the third redistribution layer 503 interconnect the first chip on wafer structure 200 and the second chip on wafer structure 300.

In such an embodiment the third redistribution layer 503 and the bridge components 403 may be formed to interconnect the first chip on wafer structure 200 and the second chip on wafer structure 300 through the TIVs 401, as illustrated in FIG. 6. In other embodiments, however, the TIVs 401 and the fifth encapsulant 501 may be omitted, and the third redistribution layer 503 and the bridge components 403 may be formed directly in connection with the TSVs 117. Any suitable configuration may be utilized.

Figure 7:
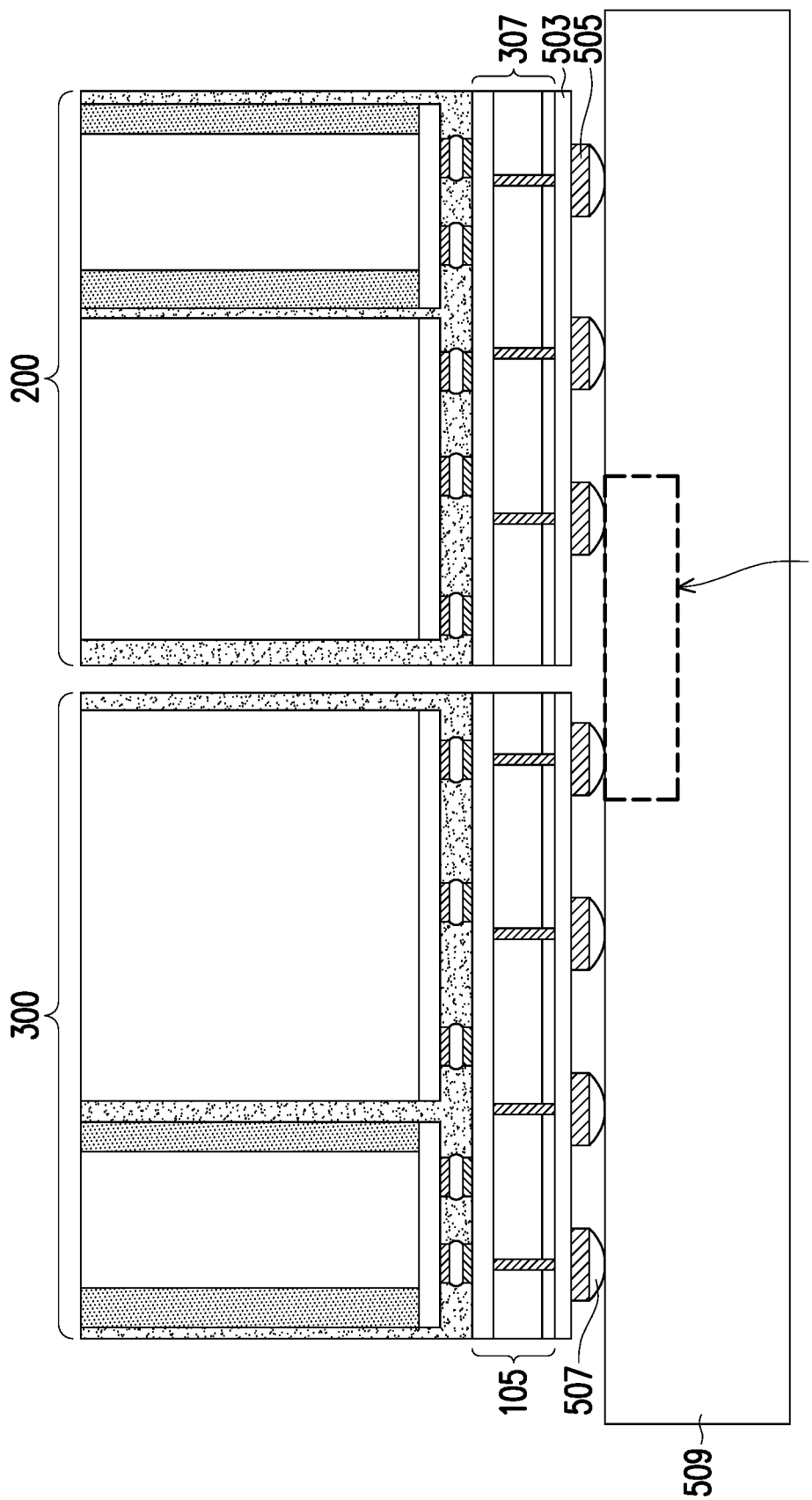
FIG. 7 illustrates the bridge components within a substrate, in accordance with some embodiments.

FIG. 7 illustrates additional embodiments in which the bridge component 403 is located adjacent to or inside of the third substrate 509. In such an embodiment the bridge components 403 may comprise electrical routing that interconnects the first chip on wafer structure 200 and the second chip on wafer structure 300. In a particular embodiment in which the third substrate 509 is a printed circuit board, the bridge components 403 comprise electrical routing on a surface of the printed circuit board which is utilized to route signals between the first chip on wafer structure 200 and the second chip on wafer structure 300, thereby interconnecting the first chip on wafer structure 200 and the second chip on wafer structure 300. In particular, the first chip on wafer structure 200 and the second chip on wafer structure 300 will be bonded to the bridge components as the first chip on wafer structure 200 and the second chip on wafer structure 300 are bonded to the third substrate 509. However, any suitable structures may be utilized to interconnect the first chip on wafer structure 200 and the second chip on wafer structure 300.

Additionally, by forming the bridge components 403 within the third substrate 509, other elements may be omitted. For example, when the bridge components 403 are located within the third substrate 509, the TIVs 401 and the fifth encapsulant 501 may be omitted. Instead, the third redistribution layer 503, the sixth external contacts 505 and the third contact bumps 507 may be formed in direct contact with the TIVs 401. Additionally, because the TIVs 401 are not formed, the encapsulation of the first chip on wafer structure 200 and the second chip on wafer structure 300 may also be omitted, and the third encapsulant 301 is not put into place. With such omissions, a smaller and more compact structure can be obtained.

By utilizing the bridge component 403 to connect the first chip on wafer structure 200 (with the first interposer 105) with the second chip on wafer structure 300 (with the second interposer 307), multiple chip on wafer structures (e.g., two or greater) with multiple interposers can be integrated together to form a molded platform and then connected to a substrate. With the ability to use multiple chip on wafer structures and multiple interposers, the use of a single interposer with the problems that come along with a single interposer can be avoided. For example, reliability issues caused by large stresses that occur with a single interposer, and fabrication issues related to the use of multiple lithographic masks such as stitching can be avoided.

In accordance with an embodiment, a semiconductor device includes: a first semiconductor device bonded to a first interposer; a second semiconductor device bonded to a second interposer different from the first interposer; and a bridge component electrically connecting the first semiconductor device and the second semiconductor device through the first interposer and the second interposer. In an embodiment the bridge component is bonded to both the first interposer and the second interposer. In an embodiment the semiconductor device further includes: a first encapsulant encapsulating both the first interposer and the second interposer; and a second encapsulant encapsulating the bridge component, the second encapsulant being different from the first encapsulant. In an embodiment the semiconductor device further includes a through via extending from a first side of the second encapsulant to a second side of the second encapsulant opposite the first side. In an embodiment the semiconductor device further includes a redistribution layer electrically connecting the first semiconductor device and the second semiconductor device to external contacts, the bridge component being located within the redistribution layer. In an embodiment the semiconductor device further includes: a third semiconductor device bonded to the first interposer; and an encapsulant encapsulating the first semiconductor device and the third semiconductor device. In an embodiment the semiconductor device further includes a substrate electrically connected to the first interposer and the second interposer, wherein the bridge component is located within the substrate.

In accordance with another embodiment, a semiconductor device includes: a bridge component; a first interposer electrically connected to the bridge component; a second interposer electrically connected to the bridge component; a first semiconductor device bonded to the first interposer and surrounded by a first encapsulant; a second semiconductor device bonded to the second interposer and surrounded by a second encapsulant; and a substrate electrically connected to the first interposer and the second interposer. In an embodiment the semiconductor device further includes a third encapsulant located between the first interposer and the second interposer, wherein the substrate is located on an opposite side of the bridge component from the first interposer. In an embodiment the semiconductor device further includes: through vias in physical contact with the first interposer; and a third encapsulant surrounding the through vias and the bridge component. In an embodiment the semiconductor device is a chip on wafer on substrate device. In an embodiment the bridge component is bonded to the first interposer and the second interposer. In an embodiment the bridge component is hybrid bonded to the first interposer. In an embodiment the bridge component is located within a redistribution layer.

In accordance with yet another embodiment, a method of manufacturing a semiconductor device, the method includes: bonding a first semiconductor device to a first interposer; encapsulating the first semiconductor device with a first encapsulant; bonding a second semiconductor device to a second interposer different from the first interposer; encapsulating the second semiconductor device with a second encapsulant; connecting the first interposer to the second interposer with a bridge component; and electrically connecting a substrate to both the first interposer and the second interposer. In an embodiment the method further includes encapsulating the first encapsulant and the second encapsulant with a third encapsulant. In an embodiment the connecting the first interposer to the second interposer further includes: forming first through vias in electrical connection with the first interposer; forming second through vias in electrical connection with the second interposer; bonding the bridge component with both the first interposer and the second interposer; and encapsulating the first through vias, the second through vias, and the bridge component. In an embodiment the bonding the bridge component with both the first interposer and the second interposer comprises hybrid bonding the bridge component with both the first interposer and the second interposer. In an embodiment the bonding the bridge component with both the first interposer and the second interposer comprises performing a reflow process. In an embodiment the method further includes bonding a third semiconductor device with the first interposer, wherein the first semiconductor device is a logic device and the third semiconductor device is a high bandwidth memory.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first chip on wafer structure, wherein the forming the first chip on wafer structure comprises:
        bonding a first semiconductor die to a first interposer;
        bonding a second semiconductor die to the first interposer;
        encapsulating the first semiconductor die and the second semiconductor die with a first encapsulant;
    forming a second chip on wafer structure, wherein the forming the second chip on wafer structure comprises:
        bonding a third semiconductor die to a second interposer;
        bonding a fourth semiconductor die to the second interposer;
        encapsulating the third semiconductor die and the fourth semiconductor die with a second encapsulant;
    encapsulating both the first chip on wafer structure and the second chip on wafer structure with a third encapsulant;
    forming through encapsulant vias through the third encapsulant on both the first chip on wafer structure and the second chip on wafer structure after the encapsulating both the first chip on wafer structure and the second chip on wafer structure;
    connecting the first chip on wafer structure and the second chip on wafer structure with a bridge device; and
    encapsulating the through encapsulant vias and the bridge device with a fourth encapsulant.

2. The method of claim 1, wherein the connecting the first chip on wafer structure and the second chip on wafer structure with the bridge device comprises hybrid bonding the bridge device with both the first chip on wafer structure and the second chip on wafer structure.

3. The method of claim 1, wherein the connecting the first chip on wafer structure and the second chip on wafer structure with the bridge device comprises reflowing external connectors between the bridge device and the first chip on wafer structure.

4. The method of claim 1, wherein the first semiconductor die is a logic die and the second semiconductor die is a memory die.

5. The method of claim 4, wherein the memory die is part of a memory stack.

6. The method of claim 5, wherein the memory stack comprises a fifth encapsulant encapsulating the memory die.

7. The method of claim 1, forming a redistribution layer on an opposite side of the bridge device from the first chip on wafer structure, the redistribution layer in electrical contact with the through encapsulant vias and the bridge device.

8. A method of manufacturing a semiconductor device, the method comprising:
    electrically connecting a first structure and a second structure with a bridge component, the first structure comprising at least one semiconductor die and a first interposer, the at least one semiconductor die being encapsulated by a first encapsulant and a second encapsulant different from the first encapsulant, wherein the first encapsulant and the second encapsulant share a planar surface opposite the interposer from the at least one semiconductor die;
    simultaneously forming through encapsulant vias through the second encapsulant on both the first structure and the second structure; and
    encapsulating the through encapsulant vias and the bridge component with a third encapsulant.

9. The method of claim 8, wherein the electrically connecting is performed at least in part with a hybrid bonding process.

10. The method of claim 8, wherein the electrically connecting is performed at least in part with a reflow process.

11. The method of claim 8, further comprising forming a redistribution layer in physical contact with the through encapsulant vias after the encapsulating the through encapsulant vias.

12. The method of claim 11, wherein the forming the redistribution layer forms the redistribution layer in physical contact with through vias extending through the bridge component.

13. The method of claim 8, wherein the at least one semiconductor die comprises a first logic die and a first memory die.

14. The method of claim 13, wherein the first memory die is part of a memory stack.

15. A method of manufacturing a semiconductor device, the method comprising:
   bonding a first semiconductor device to a first interposer;
   encapsulating the first semiconductor device with a first encapsulant;
   bonding a second semiconductor device to a second interposer different from the first interposer;
   encapsulating the second semiconductor device with a second encapsulant, wherein the second encapsulant is different than the first encapsulant;
   connecting the first interposer to the second interposer with a bridge component; and
   electrically connecting a substrate to both the first interposer and the second interposer.

16. The method of claim 15, further comprising encapsulating the first encapsulant and the second encapsulant with a third encapsulant.

17. The method of claim 15, wherein the connecting the first interposer to the second interposer further comprises:
   forming first through vias in electrical connection with the first interposer;
   forming second through vias in electrical connection with the second interposer;
   bonding the bridge component with both the first interposer and the second interposer; and
   encapsulating the first through vias, the second through vias, and the bridge component.

18. The method of claim 17, wherein the bonding the bridge component with both the first interposer and the second interposer comprises hybrid bonding the bridge component with both the first interposer and the second interposer.

19. The method of claim 17, wherein the bonding the bridge component with both the first interposer and the second interposer comprises performing a reflow process.

20. The method of claim 19, further comprising bonding a third semiconductor device with the first interposer, wherein the first semiconductor device is a logic device and the third semiconductor device is a high bandwidth memory.

* * * * *